United States Patent [19]
Lian-Mueller

[11] Patent Number: 5,103,291
[45] Date of Patent: Apr. 7, 1992

[54] HERMETICALLY SEALED PACKAGE FOR ELECTRONIC COMPONENTS

[75] Inventor: Lie B. Lian-Mueller, Pleasanton, Calif.

[73] Assignee: Hewlett-Packard Company, Palo Alto, Calif.

[21] Appl. No.: 616,665

[22] Filed: Nov. 21, 1990

Related U.S. Application Data

[63] Continuation-in-part of Ser. No. 400,472, Aug. 30, 1989, abandoned.

[51] Int. Cl.$^5$ .................. H01L 23/28; H01L 23/29; H01L 23/02; H01L 39/02
[52] U.S. Cl. ........................... 357/74; 357/72; 357/73; 357/80
[58] Field of Search .................. 357/74, 72, 80, 70, 357/73

[56] References Cited

U.S. PATENT DOCUMENTS

| | | | |
|---|---|---|---|
| 3,736,475 | 5/1973 | Berner | 357/72 |
| 4,722,137 | 2/1988 | Ellenberger | 357/74 |
| 4,958,216 | 9/1990 | Tanaka et al. | 357/74 |

FOREIGN PATENT DOCUMENTS 61-74354 1/1986 Japan .................. 357/74

OTHER PUBLICATIONS

"Finite Element Modeling for Optimizing Hermetic Package Reliability", by John H. Lau and Lie B. Lian, The American Society of Mechanical Engineers, 88-WA/EEP-14, 9 pages, Nov. 27-Dec. 2, 1988.

Primary Examiner—Jerome Jackson, Jr.
Assistant Examiner—Carl Whitehead, Jr.

[57] ABSTRACT

This package for discrete electronic components is hermetically sealed, has very low parasitic inductance and capacitance, small size, 50 ohm input and output leads, and is suitable for surface mount applications. The package has a ceramic base and lid hermetically sealed together with a solder glass seal. The ceramic base has metallized areas deposited on only the top surface to which external metal leads are brazed. The electrical contacts to the component are by way of the metallized areas, which serve double duty as mechanical attachments for the leads and electrical contacts for the component. By having the glass seal between the lid and the metallized areas, higher reliability hermetic sealing is obtained as compared with sealing to the external leads.

12 Claims, 3 Drawing Sheets

HERMETICALLY SEALED PACKAGE FOR ELECTRONIC COMPONENTS

CROSS-REFERENCE TO RELATED APPLICATION

This application is a continuation-in-part of U.S. patent application Ser. No. 07/400,472, filed Aug. 30, 1989 now abandoned.

FIELD OF THE INVENTION

This invention relates to a hermetically sealed package for solid state components, in particular for high frequency applications.

BACKGROUND

There are several different types of packages being used in the microwave industry for discrete small signal components and devices. These packages range from 6 GHz to 20 GHz in limiting frequency and vary from high reliability ceramic packages to low cost plastic packages. There remains a desire for a small size package including hermetic sealing, surface mount capability and microstrip compatibility, operating frequency up to 22 GHz, and the ruggedness and reliability to meet JAN-S requirements for environmental testing, i.e., the level of testing required for space quality devices.

The problem has been that the requirements for these features tend to be mutually contradictory. To be hermetic and meet the JAN-S requirements, the package usually has to be fairly large in order to have good lead strength and to have room for a hermetic seal. Conversely, to operate up to 20 GHz the package must be made very small to prevent cavity oscillation. Also, the parasitic capacitance from lead to lead must be very low, on the order of 0.05 pF, but the dielectric constants of hermetic ceramic package materials are fairly high, so line coupling must be kept to a minimum. To operate well in the 20 GHz range, the leads must be close to 50 ohm transmission lines. But this imposes physical and electrical constraints on the sealing material and makes hermetic sealing more difficult to achieve. Such considerations have made design and manufacture of suitable packages difficult.

A variety of prior art packages have some, but not all, of such features. The one most similar to the present invention is described and illustrated in U.S. Pat. No. 4,722,137, which also includes a description of processes for making such a package. This patent also describes in its background portion several prior approaches to packaging high frequency electronic components.

Even with the improvements described in the '137 patent, some failures of hermetic sealing are still found upon testing to the JAN-S requirements. In other words, it is desirable to enhance the yield of acceptable packages as compared with the yield obtainable by manufacturing packages as described in the '137 patent.

A mode of failure sometimes observed in such packages is lack of a hermetic seal, particularly after thermal cycling. It is believed that microcracks form in the glass seal between the base and lid of such packages, permitting unacceptable leakage. It is, therefore, desirable to provide means for reducing incidents of such microcracks or other sources of decreased yield of packages similar to those described in the '137 patent, without detracting from the desirable electrical characteristics of these packages nor increasing manufacturing costs. It is desirable if the improved yield is obtainable with manufacture of the product on the same assembly processes presently used.

SUMMARY OF THE INVENTION

There is, therefore, provided in practice of this invention according to a presently preferred embodiment, a hermetically sealed package for an electronic component comprising a ceramic base and a ceramic lid, with an electronic component mounted in the center of the base under the lid. A pair of metallized areas are deposited on a top surface of the base to provide electrical connection to the component. External metal leads are package for making external electrical connections. A hermetic glass seal is formed between the lid and base, wetting a portion of the base and over a portion of the metallized areas. The portion of the external leads wetted by the glass seal is shorter than the width of the glass seal. That is, the external electrical leads do not extend all the way through the glass seal so that a hermetic seal is maintained between the glass and an area over the metallized areas instead of to the leads themselves. Preferably a layer of ceramic the same as the base ceramic is provided between the metallized leads and the glass seal. It is particularly preferred to provide an annular ring of ceramic inwardly from the ends of the external metal leads for sealing to the glass.

It is found with such an arrangement that high reliability hermetic sealing can be obtained despite thermal cycling. It is believed that decreased yield in the prior package described in the '137 patent may be due to a thermal expansion coefficient mismatch with a brazing alloy connecting the external leads to the metallized areas. By avoiding extension of this braze alloy completely through the glass seal, the area of mismatch is minimized and a reliable seal is obtained.

BRIEF DESCRIPTION OF THE DRAWINGS

These and other features and advantages of the present invention will be appreciated as the same becomes better understood by reference to the following detailed description when considered in connection with the accompanying drawings wherein.

DETAILED DESCRIPTION

Figure 1:
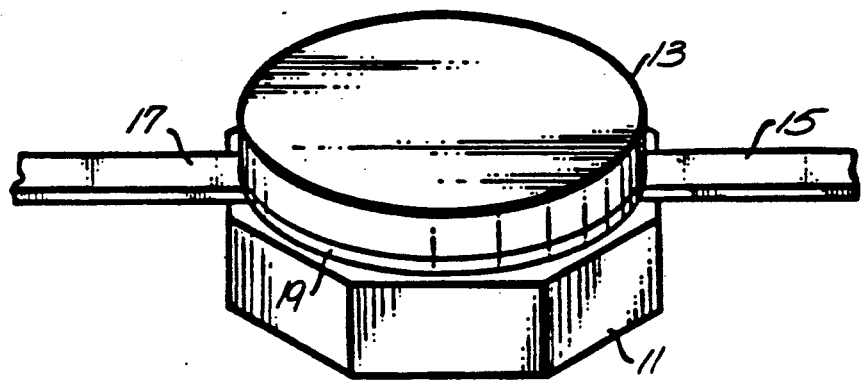
FIG. 1 is an external perspective view of a package constructed according to principles of this invention.

The package for discrete microwave components provided in practice of this invention comprises a base 11 for mounting a discrete component 25 and a lid 13 which has an internal cavity 35 for enclosing the component. External metal leads 15 and 17 are brazed to the top of the base for connection of the component to an external electrical circuit within which it is to be used. A layer of lead oxide glass 19 provides a hermetic seal between the base 11 and lid 13. The base and lid are made of 92 to 96 percent aluminum oxide which has a dielectric constant of 8.5, and a coefficient of thermal expansion of about $7.2 \times 10^{-6}$ per degree centigrade. The external electrical leads are made of Kovar alloy (ASTM alloy F15 or Alloy 42) which has a coefficient of thermal expansion of $6.2 \times 10^{-6}$. In the finished package the external electrical leads are gold plated for meeting the JAN-S environmental standards.

The base is an octagonal (or round) alumina wafer about 1.8 mm across and 0.38 mm thick. The octagonal shape provides for distribution of stresses on brazed areas, relatively small maximum diagonal measurement, room to accommodate the glass seal, and corners which can be used for aligning the leads during brazing.

Two metallized areas 21 and 23 are deposited on the top surface of the base to provide a surface for brazing the external electrical leads and making electrical contact with the component. While any suitable metal may be used for the metallized areas, tungsten has been found to be particularly advantageous. There is no metallization on the bottom or sides of the base, thereby minimizing the parasitic inductance and capacitance of the package. A layer of tungsten is deposited on the surface by screening on a tungsten paste and firing in hydrogen to provide a layer about twenty micrometers thick. The metallized areas are nickel plated.

The external leads are brazed to the metallized areas on the top of the base by a copper-silver brazing alloy 22 which provides very good adhesion and bond strength between the leads and base. The approximate coefficient of thermal expansion of the brazing alloy is $19.3 \times 10^{-6}$ per degrees centigrade. It is believed that the relatively high thermal expansion coefficient mismatch of the brazing alloy has caused high thermal stress and microcracking in the glass sealing layer along the edge of the brazing material in the prior package.

Thus, in the improved package provided herein, each of the external leads ends after overlapping a short distance across the respective metallized area. The ends 24 of the leads do not extend the full length of the metallized area. Instead the electronic component 25 is connected between the metallized areas 21 and 23 which make electrical contact between the external leads and the component. In an exemplary embodiment the component comprises a beam lead device such as a diode attached to the metallized areas by beam leads 27 and 29. The leads 27 and 29 may be connected to the metallized areas by any of a variety of brazing or welding techniques. Series resistance welding has been found to be particularly suitable, and has not required any changes in package processing.

Figure 2:
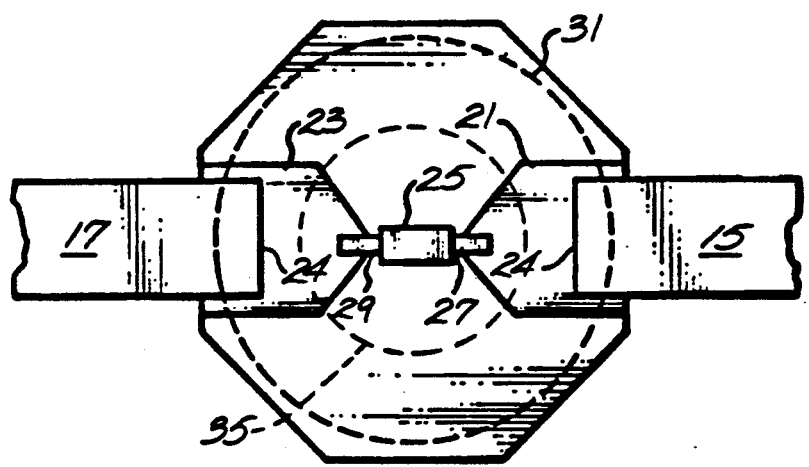
FIG. 2 is a plan view of the top surface of a ceramic base for the package.

After brazing the leads on the metallized areas, the leads and the exposed braze metal are nickel plated with electrolytic or electroless nickel. FIG. 2 shows a circular area 31 on which photoresist is deposited before gold plating the external leads 15 and 17. After gold plating, the photoresist layer is removed, leaving an exposed alumina surface on the base and a nickel plated surface over the leads, braze metal, and metallized areas. The nickel layer helps form a good hermetic seal when the lid is attached to the base with a glass seal.

A ring of solder glass is deposited on the annular bottom surface of the lid surrounding the cavity 35. The lid is placed on the base so that the glass ring overlays an annular portion of the clean area 31 previously covered by the photoresist. The assembly is then heated to flow the glass and wet the lower surface of the lid, the upper surface of the base, the exposed portion of the metallized areas, and a portion of the external leads, thereby forming a hermetic seal. The heating can be, for example, in an infrared belt furnace.

In an exemplary embodiment, the glass seal comprises a lead oxide glass in the T191 BF family (equivalents are KC-402 and SG-202). This glass has good strength, low sealing temperature (about 420° C.), a relatively low dielectric constant (12.2), and a coefficient of thermal expansion compatible with the other materials employed ($6.7 \times 10^{-6}$ per degree centigrade).

The leads are brazed to the metallized areas on the base for providing sufficient lead strength and fatigue resistance to meet the JAN-S requirement, and to meet the size constraint for microwave operation. Brazing the leads to the top of the base keeps the parasitic capacitance to a minimum and also allows for a 50 ohm input and output impedance in both surface mount and microstrip mounting configurations. Placing the glass seal over a portion of the leads on the top of the base provides added strength.

The above-mentioned Pat. No. 4,722,137 describes a sequence of plating, coating, cleaning, etc., steps for forming the prior package. A similar sequence of steps may be employed for completing the package provided in practice of this invention.

It is found that having the wetted portion of the external leads shorter than the width of the glass seal assures much more consistent and better hermetic sealing than the prior package where the external leads extend all of the way through the glass seal. The inner portions of the metallized areas are sufficient for electrical contact to the component mounted in the package and provide, along with the adjacent alumina base, at least an annular area around the component inwardly from the ends of the external leads where all of the materials have sufficiently similar coefficients of thermal expansion to maintain a hermetic seal regardless of thermal cycling. Having the external metal leads secured to only an outer portion of the metallized areas can provide sufficient lead strength to meet the JAN-S standards.

Packages made in accordance with the '137 patent and packages made in accordance with practice of this invention, were tested to assure that a hermetic seal was maintained. A helium leak test was used as well as a dye penetrant test. Packages made in accordance with the '137 patent had from 57 to 79 percent acceptable parts. About 99 percent of the packages made in accordance with practice of this invention were found to be acceptable in such tests.

Packages made in practice of this invention were subjected to thermal shock in the form of 200 cycles between −65° C. and +175° C. and passed the test (sample size 78, LTPD 3).

The packages also passed the following tests with a sample size of 78 and an LTPD of 3 (Mil-S-19500 and Mil-S-38510): Mil-Std-750C "Lead Fatigue, Test Condition B2", Method 20004.4; Mil-Std-750C "Mechanical Shock" Method 2016-2; Mil-Std-750C "Vibration, Variable Frequency", Method 2056; Mil-Std-750C "Acceleration" Method 2006; Mil-Std-750C "Steady State Operation Life", Method 1026; and Mil-Std-750C "Burn-in (For Diodes and Rectifiers)", Method 1038.

An additional advantage in making electrical contact between the component and the metallized areas rather than direct electrical contact between the external leads and the component is a relaxation of manufacturing tolerances. No change is required in the tolerance for deposition of the metallized areas for the new versus the old packages. However, careful positioning of the metal leads was required in the prior package so that the component could be connected thereto. The location of the leads on the metallized areas is less critical when the leads do not extend all the way through the glass seal and electrical connection is made between the metallized areas in the component.

Although the package described and illustrated herein has a two-lead component, the package is equally suitable for multiple-lead components. An octagonally shaped base is particularly suited to components having up to eight leads.

Figure 3:
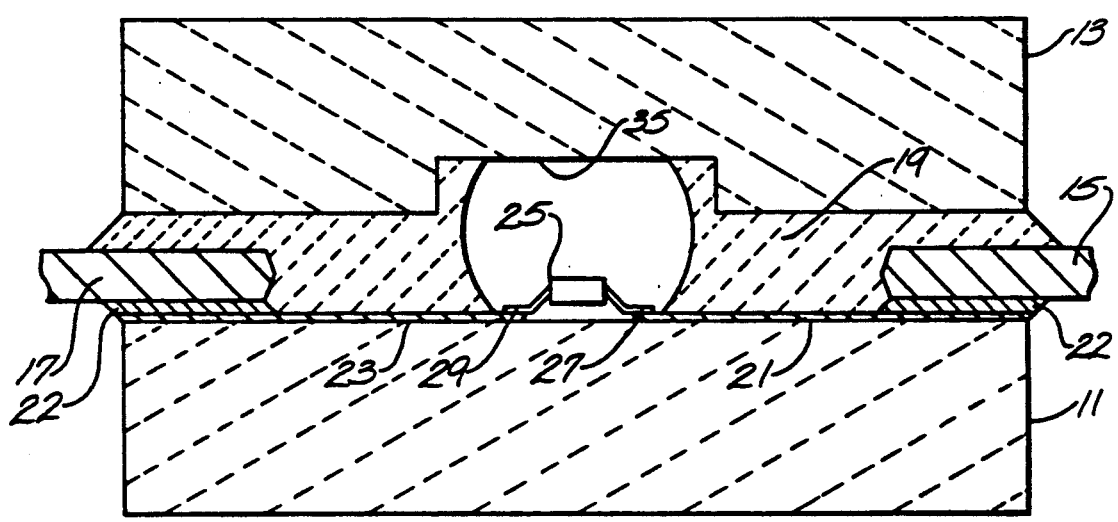
FIG. 3 is a transverse cross section through the package.
Figure 4:
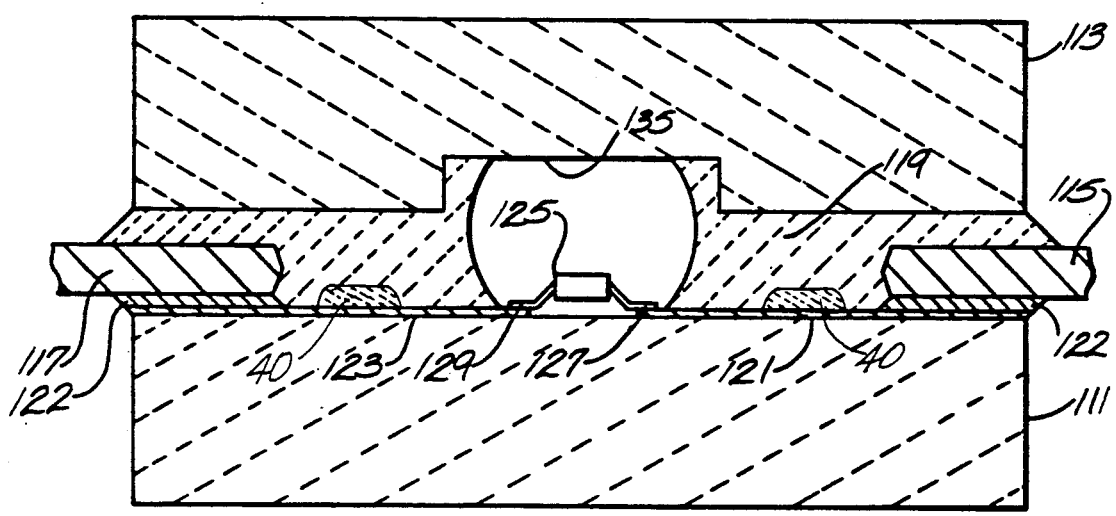
FIG. 4 is a transverse cross section through another embodiment of package.

An additional improvement in yield has been provided by an embodiment having a transverse cross section as illustrated in FIG. 4. In this embodiment, most of the structure is identical to the embodiment illustrated in FIGS. 1 to 3. The components are, therefore, identified by the same reference numerals plus 100. Thus, for example, the ceramic base is identified with numeral 11 in the first embodiment and is labeled 111 in the embodiment illustrated in FIG. 4.

The change which significantly enhanced yield of sound packages comprises an annular ring 40 of alumina, the same ceramic as the base, overlying the metallized areas 121 and 123 and the base 111 between the metallized areas. The glass seal 119 adheres well to the alumina ring and provides a hermetic seal.

It was found in processing relatively large batches of packages that some variation in yield persisted. Some batches had excellent hermetic seals with essentially 100% yield and occasional batches had as high as 25% of packages with leakage. It is thought that some remaining differences in coefficient of thermal expansion between the metal and glass sometimes contributed to micro-cracking. Quality control for uniformly preventing such cracking proved troublesome.

It is believed the microcracking may be due to the presence of some excess braze alloy on a portion of the metallized areas inwardly from the ends of the external leads. The process for the first embodiment involves screening a tungsten paste onto the alumina substrate and high temperature firing in hydrogen to sinter the alumina and secure the tungsten to the alumina. The tungsten metal leads so produced were then nickel plated and the external leads brazed in place.

It sometimes occurs that excess braze metal overflows beyond the leads and this is removed by etching. Imperfect etching may leave some braze metal on the metallized areas beyond the leads and interfere with subsequent hermetic sealing..

The process was, therefore, changed to add alumina over the metallized leads. The sequence was changed so that after screening the tungsten paste on the ceramic blank from which the base is made, an annular ring of alumina paste is screened over the tungsten. When the blank is then fired in hydrogen, the alumina ring adheres tightly to the tungsten leads and essentially becomes integral with the base between the leads.

After firing, the exposed portion of the leads is nickel plated, and the external leads are brazed in place on the outer portion of the metallized areas. The ring of alumina essentially forms a dam which prevents flow of braze alloy inwardly from, the ends of the leads. The etching step may, therefore, be deleted.

After brazing the leads, the product is nickel plated and gold plated, and the electronic component 125 is bonded in place on the inner ends of the metallized areas. The cover 113 is then sealed in place by the glass seal 119, as previously described. The glass bonds to the external metal leads, to exposed parts of the metallized areas between the component and external leads, to the alumina stripe overlying a portion of the metallized areas, and to the base. A good hermetic seal is obtained between the glass and alumina. With this change in the structure, essentially 100% yield is uniformly obtained.

The added ring of alumina is actually quite tiny, having a thickness of 25 to 50 microns and a width of about 125 microns. All that is needed to provide a hermetic seal is a stripe of alumina overlying the metallized areas. It is convenient, however, to screen an annular ring of alumina on the base for a variety of reasons. With such a ring, there is no care required for orienting the base for receiving the ring. Furthermore, the same ring may be used whether the component package has two, three or four external leads.

The improved embodiment costs no more than the earlier embodiment. The addition of the alumina ring requires only a screening step. No additional steps are required for firing and subsequent processing. Previously, a photoresist was applied to prevent gold plating in the areas where the glass to metal hermetic seal is formed. That step, as well as the etching for removing excess brazing alloy, may now be avoided. Thus, for no additional cost and some simplicity in the procedures, a more reliable product has been obtained.

What is claimed is:

1. An electronic component package comprising:
   a ceramic base;
   at least a pair of metallized areas deposited on a top surface of the base, each metallized area having an outer end at an outer portion of the base and an inner end in a center portion of the base, leaving a non-metallized area between the inner ends of the metallized areas;
   an electronic component connected to the inner ends of at least two of the metallized areas and overlying the non-metallized area;
   external metal leads secured to the metallized areas, the leads each having an inner end spaced apart from the non-metallized area of the base and an outer end extending out of the package;
   a ceramic lid including an annular sealing area; and
   a hermetic glass seal between the lid and base, the seal wetting the lid, a portion of the base circumferentially between the metallized areas, a portion of the metallized areas between the inner ends of the leads and the non-metallized area, and a portion of the leads outwardly from their inner ends, the wetted portion of the leads being shorter than the width of the glass seal for maintaining an annular seal to the metallized areas and adjacent base inwardly of the inner ends of the external leads.

2. An electronic component package comprising:
   a ceramic base;
   at least a pair of metallized areas deposited on a top surface of the base, each metallized area having an outer end at an outer portion of the base and an inner end in a center portion of the base, leaving a non-metallized area between the inner ends of the metallized areas;
   external metal leads brazed to only an outer portion of the metallized areas, the leads each having an inner end spaced apart from the non-metallized area of the base and an outer end extending out of the package;
   a layer of ceramic over at least a portion of the metallized areas outwardly from the center portion of the base and inwardly from the inner ends of the external leads;

an electronic component connected to the inner ends of at least two of the metallized areas and overlying the non-metallized area;

a ceramic lid including an annular sealing area; and an annular hermetic glass seal sealed on one face to the annular sealing area of the lid and on the other face to a portion of the leads outwardly from their inner ends, portions of the base circumferentially between the metallized areas, and over at least a portion of the metallized areas between the inner ends of the leads and the non-metallized area including the layer of ceramic on the metallized areas.

3. An electronic component package as recited in claim 2 wherein the layer of ceramic comprises an annular ring of ceramic overlying the metallized areas inwardly from the inner ends of the leads and a portion of the base circumferentially between the metallized areas.

4. An electronic component package as recited in claim 2 wherein the layer of ceramic comprises the same ceramic as the base.

5. An electronic component package comprising:

a ceramic base;

a ceramic lid;

a pair of external metal leads, each lead having an inner end spaced apart from the center of the base and having an outer end extending out of the package;

a hermetic glass seal between the lid and the base and overlapping a portion of the metal leads between the inner ends of the leads and an outer edge of the base;

an electronic component mounted on the center portion of the base; and at least a pair of metallized areas adhering to a top surface of the base connected in a first portion to the external metal leads within the glass seal of the package and in another portion spaced inwardly from the first portion to the component so that the hermetic seal is between the lid and the metallized areas inwardly from the inner ends of the external metal leads and an area of the base circumferentially between the metallized areas.

6. An electronic component package as recited in claim 5 further comprising a layer of ceramic between the glass seal and the metallized areas inwardly from the inner ends of the external metal leads.

7. An electronic component package as recited in claim 6 wherein the layer of ceramic comprises an annular ring of ceramic overlying the metallized areas inwardly from the inner ends of the leads and a portion of the base.

8. An electronic component package as recited in claim 6 wherein the layer of ceramic comprises the same ceramic as the base.

9. An electronic component package comprising:

a ceramic base;

a ceramic lid;

an annular hermetic glass seal between the lid and the base;

a pair of external metal leads having inner ends embedded within the glass seal and outer ends extending out of the package; and an electronic component mounted on the center portion of the base; and characterized by:

at least a pair of metallized areas deposited on a top surface of the base inwardly from the inner ends of the leads, leaving a non-metallized area in the center of the base, for making electrical connection between a portion of the external metal leads within the glass seal of the package and the component; and a layer of ceramic over a portion of the metallized areas inwardly from the inner ends of the leads and beneath the glass seal so that the hermetic glass seal is between the lid and at least the layer of ceramic.

10. An electronic component package as recited in claim 9 wherein the glass seal overlaps a portion of the external metal leads between the inner ends of the leads and the outer edge of the base.

11. An electronic component package as recited in claim 10 wherein the layer of ceramic comprises an annular ring of ceramic overlying the metallized areas inwardly from the inner ends of the leads and a portion of the base.

12. An electronic component package as recited in claim 10 wherein the layer of ceramic comprises the same ceramic as the base.

* * * * *